United States Patent [19]

Conley et al.

[11] Patent Number: 5,240,812
[45] Date of Patent: Aug. 31, 1993

[54] TOP COAT FOR ACID CATALYZED RESISTS

[75] Inventors: Willard E. Conley, Cornwall; Ranee W. Kwong; Richard J. Kvitek, both of Wappingers Falls; Robert N. Lang, Pleasant Valley; Christopher F. Lyons, La Grangeville; Steve S. Miura, Poughkeepsie; Wayne M. Moreau, Wappingers Falls; Harbans S. Sachdev, Hopewell Junction; Robert L. Wood, Poughkeepsie, all of N.Y.

[73] Assignee: International Business Machines Corporation, Armonk, N.Y.

[21] Appl. No.: 793,884

[22] Filed: Nov. 18, 1991

Related U.S. Application Data

[62] Division of Ser. No. 587,273, Sep. 18, 1990, abandoned.

[51] Int. Cl.$^5$ .............................................. G03C 1/492
[52] U.S. Cl. ...................................... 430/273; 430/162
[58] Field of Search ................................ 430/273, 162

[56] References Cited

U.S. PATENT DOCUMENTS

| | | | |
|---|---|---|---|
| 3,298,852 | 1/1967 | Beatty et al. | 430/168 |
| 3,652,273 | 3/1972 | Htoo | 430/273 X |
| 4,356,252 | 10/1982 | Lee | 430/270 |
| 4,663,275 | 5/1987 | West et al. | 430/271 |
| 4,940,646 | 7/1990 | Pawlowski | 430/197 X |

Primary Examiner—Marion E. McCamish
Assistant Examiner—Mark A. Chapman
Attorney, Agent, or Firm—Dale M. Crockatt

[57] ABSTRACT

A protective material for use as an overcoating film for acid catalyzed resist compositions comprising a polymeric film forming compound, the films of which are impermeable to vapors of organic and inorganic bases.

8 Claims, No Drawings

TOP COAT FOR ACID CATALYZED RESISTS

BACKGROUND OF THE INVENTION

This application is a division application of Ser. No. 07/587,273 filed Sep. 18, 1990, now abandoned.

1. Field of the Invention

The invention relates to acid catalyzed resist formulations. More particularly, the present invention is concerned with a protective topcoat material for use as an overcoating film for acid catalyzed resist compositions.

2. Background Art

The problem of protecting materials from gaseous contamination is one of long standing The solution has generally been to provide a coating or encapsulation with a material which is impervious to the deleterious gas.

U.S. Pat. No. 3,753,715 sets forth know uses of a certain water soluble macromolecular organic polymers as prior art in controlling oxygen diffusion in photopolymerizable a copying process. Such barrier materials include polyvinyl alcohol and its partial esters, and partial acetals, as well as other natural and synthetic materials of higher molecular weights such as gelatin, gum arabic, copolymer of methylvinyl ether and maleic anhydride, polyvinyl pyrrolidones, and water soluble polymers of ethylene oxide with molecular weights in the range from 100,000 to 3,000,000. Wetting agents in relatively small quantities have been included in such aqueous coating solutions. The drawbacks of such barrier materials (at least as they apply to photopolymerization copying) include the necessity for certain minimum drying times to form homogeneous coatings and the impermeability of the layers to light that an effective oxygen transfer cannot be maintained.

That patent (U.S. Pat. No. 3,753,715) is particularly directed to and claims a photopolymerizable copying material comprising a support, a photopolymerizable copying layer thereon containing a photoinitiator and a low molecular weight vinyl or vinylidene compound polymerizable by exposure to light, and a top layer only slightly permeable to oxygen and transparent to actinic light, said top layer, containing as an oxygen barrier, at least one carbohydrate having a molecular weight of less than 1000.

U.S. Pat. No. 3,652,273 discloses the use of polyvinylbutyral as a topcoat for photoresist. This topcoat provides protection against oxygen and high humidity and results in less scumming of and pinholing in the hydrophobic resist The topcoat film is soluble in the developer and does not interfere with imaging.

U.S. Pat. No. 4,756,988 discloses the use of a non-photosensitive crosslinkable adhesive layer to provide performance improvements in the areas of resistance to crazing of the film during storage, photosensitivity in that the photospeed is increased to make the films more processable, enabling the fabrication of photoresists without using alkoxysilane adhesion promoters, and improving thermal dimensional stability of the film during plating and etching processes. The topcoat compositions include terpolymers of ethylacrylate, methylacrylate and acrylic acid.

IBM Technical Disclosure Bulletin, Vol. 12, No. 9, pp. 1418-19, discloses the use of azidosulfono-stilbene films as a topcoat to prevent oxygen diffusion into photoresist films to consume sensitizer radicals. The polyvinyl acetate impedes oxygen diffusion.

Japanese Patent Publication 58-178348 is directed to a process for forming images by exposing a photosensitive material prepared by coating a substrate with a photosensitive layer and a protective layer of polyvinyl alcohol which is water insoluble but is water swellable after exposure to light, removing the polyvinyl alcohol layer with water and developing the photosensitive layer.

European Patent Application 0160468 is directed to the use of a number of materials including polyethylene oxide as a protective topcoat against ozone generated in a flexographic printing process. The use of this topcoat leads to the improved adhesion of inks to corona treated cardboard.

Japanese Patent Publication No. 60 200249 relates to the use of a polyvinyl alcohol as an antisticking layer between a topcoat layer and a photosensitive layer on a substrate.

IBM Technical Disclosure Bulletin Vol. 27, No. 11, April 1985, p 6521 discloses the use of polyvinyl alcohol as a top depth-of-focus enhancement layer owing to the optical properties of the polyvinyl alcohol film. No suggestion of barrier properties is made.

Acid catalyzed resists are based upon mechanisms which involve the radiation induced generation of a Lewis or Bronsted acid from acid precursors such as sulfonates and triflates of onium salts and oxime and dicarboximide derivatives. The radiation induced formation of acid catalyzes the decarbonylation of the resist such as the poly-p-tertbutyloxycarbonyloxystyrene compositions as set forth in U.S. Pat. No. 4,491,628. Other acid catalyzed reactions include the cleaving of diacetals of novolaks and the acid catalyzed crosslinking of epoxy and melamine based resists. Although acid catalyzed image amplified resist are very reactive compositions, i.e., they have a high photospeed, they also exhibit an extreme sensitivity to environmental chemicals present in the process areas, even when they are present only at the p.p.b. level. If wafers having an imaged and exposed acid catalyzed resist such as poly-p-tertbutyloxycarbonyloxystyrene are left open to process air, they suffer from profile deterioration and eventually no discernible images will be formed. The desensitization of the resist is believed to be due to the poisoning of the acid generator and the acids formed by the absorption of vapors of organic amines and/or inorganic bases.

Controlled laboratory experiments in which chemically amplified resist compositions were prepared using trifluoromethylsulfonyloxy bicyclo[2.2.1]-hept-5-ene-2,3-dicarboximide (hereinafter MDT) which is disclosed in U.S. patent application, Ser. No. 07/322,848 filed Mar. 14, 1989 as the sensitizer and on one hand poly-p-tertbutyloxycarbonyloxystrene and on the other poly-p-hydroxystyrene p-tertbutyloxycarbonyloxystyrene. These compositions were exposed to ppb levels of organic vapors of N-methyl-2-pyrrolidone(NMP), ammonia, pyridine and triethylamine and rapid desensitization of the resists was noted. Since these resists are sensitive to organic vapors at the ppb levels, it is not practical or economical to remove all of these vapors from a manufacturing process area or from inside of those tools, designed to operate at atmospheric conditions. Additionally, a wafer may be exposed to process air for up to 15 minutes inside a deep UV stepper or scanning tool. Different portions of large wafers, e.g., 200 mm diameter wafers may experience different periods of exposure to process air. Desensitization may cause certain portions of the wafer to be undeveloped or have localized distorted images.

We have found that the application of a thin (about 1200 Angstroms) barrier layer on top of an acid sensitized, environmentally sensitive resist provides adequate short term protection (up to 24 hours) for such resist even when it is processed in atmospheres having an organic amine or NMP vapor concentration greater than or equal to 1 part per million.

The barrier layer has also been found to increase the sensitivity of coated acid sensitized resists when such resists are used in electron beam tools. Uncoated resists tend to experience an outgassing of acid and acid-degraded fragments due to their partial pressures. The use of the barrier inhibits the removal of acid from the resist film and, therefore, enhances the effect of the acid in promoting the patterned exposure.

Barrier topcoats have been previously used to protect free radical based resist systems which are oxygen sensitive. These include a 25 um Mylar film on DuPont Riston acrylate crosslinking resist and the use of 2 um film of polyvinylalcohol on top of a free radical polyolefin sulfone-novolak based x-ray resist. For such uses, films of polyvinylalcohol thinner than about 0.5μm does not function as an effective oxygen barrier topcoat. The thicker barriers are thought to prevent oxygen from diffusing into the exposed resist films and consuming some or all of the radical initiators. Topcoats which inhibit oxygen poisoning of radical systems are not inherently useful in the inhibition or "poisoning" of acid based resist systems which are quite tolerant of oxygen. To be effective, a topcoat has to be compatible with the particular resist protected and designed to prevent deleterious vapor phase reactions. In the case of acid catalyzed resists entailing the cleavage of an acid labile protecting group from a reactive functional site, the acid initiator causes the production of a large amount of gaseous products. A protective topcoat has to be thin and permeable in order to allow the gaseous reaction products formed during post exposure bake to diffuse through the resist and the topcoat film without bubble formation or distortion of the underlying resist.

Some considerations which contribute to the usefulness of polyacrylic acid as topcoat are:

(1) a low molecular weight <5000 (Higher molecular weights caused blistering in postexposure bake of partially t-butylcarboxylated poly-p-hydroxystyrene);

(2) a low sodium metal or ammonium ion content <100 ppm. Metallic or basic impurities in topcoat can desensitize the acid formed during exposure;

(3) an acid pH level >2 to prevent undesired acidolysis of the underlying resist during prebake;

(4) optical transparency in the deep UV: Absorbence <0.1 before or during exposure;

(5) a papid dissolution in alkaline developer;

(6) upper film thickness limit of about 200 nm to prevent blistering of the acid catalyzed resist which evolve gases;

(7) an acidic moiety contained in the film which reacts with basic organic or inorganic materials.

Similar properties for polyvinylbutyral topcoat were noted.

Example 1–A 1μm film on silicon wafer of an acid catalyzed resist comprising poly-p-tertbutyloxycarbonyloxystyrene resist containing 4% by weight of triphenylsulfonium hexafluoroantimonate made in accordance with the method set forth in U.S. Pat. No. 4,491,628 was exposed on Perkin-Elmer deep UV scanner (200-290 nm exposure band) and left standing for several minutes in a lab before post-exposure baking. After post expose baking and development in anisole, the 1 um lines of resist images were found to have overhanging "T" shapes. A companion wafer processed with a topcoat of 100 nm of polyvinylbutyral cast from butanol was found to form good straight wall profiles without "T" overhangs. When the uncoated resist was exposed to longer periods of time of process air (25 hours) no images were formed in the uncoated resist film and only slight traces of overhang formation in the polyvinylbutyral topcoated acid catalyzed resist. A protection time of 30 minutes is considered adequate for even the slowest exposure tools.

Example 2—A 1.0μm film on silicon wafer of an acid catalyzed resist comprising a partially t-butyloxycarbonyloxylated poly-p-hydroxystyrene sensitized with 8% MDT was exposed by Perkin-Elmer deep UV scanner and left in lab air for fifteen minutes prior to postexpose baking and developing in 0.25N alkaline TMAH. No images were formed. A second film of prebaked partially t-butyloxycarbonyloxylated poly-p-hydroxystyrene was overcoated with a 100nm (0.1 μm) topcoat of polyacrylic acid cast from 6% by weight water based system and dried for 3 minutes at 90° C. The film was exposed and processed in a similar manner. Good 1 μm profiles were formed.

Example 3—A 1.0μm film on a silicon wafer of the partially t-butyloxycarbonyloxylated poly-p-hydroxystyrene sensitized with MDT was exposed at 2.5 μC/cm$^2$ with a 25 KeV electrons. A faint image which was not developed out was formed. A similar partially t-butyloxycarbonyloxylated poly-p-hydroxystyrene with a 150nm topcoat of polyacrylic acid processed in a similar manner gave good 0.5μm profiles Example 4—A 1.0μm film on silicon of Ray PF (Hoechst, positive tone acid catalyzed resist) was exposed to x-rays under partial vacuum conditions. A dose of 60 mJ/cm$^2$ was required to resolve images and the smallest feature resolved was a 0.75μm line/space array. A similar film overcoated with 0.12μm of poly(acrylic acid) required a dose of 20mJ/cm$^2$ to resolve images and the smallest feature on the mask (0.25μm space×0.50μm line) was resolved.

The following tables show the usefulness of some topcoat materials with specific acid catalyzed resists.

TABLE 1

| Partially t-Butyloxycarbonyloxylated poly-p-hydroxystyrene Resist | |
|---|---|
| TOPCOAT | PERFORMANCE |
| Polyacrylic acid | 24 hrs protect, no blister |
| Polyvinyl alcohol | 15-20 min protect, slight blister and image residues after development |
| Polyvinylpyrrolidone | no protection, desensitization |
| Polystyrene sulfonic acid NH$_4$+ | no protection, desensitization |
| Polystyrene sulfonic acid | good protection as effective as polyacrylic acid (pH has to be above 2) |
| Polymethacrylic acid | blistering |

TABLE 2

| t-Butyloxycarbonyloxystyrene Resist | |
|---|---|
| TOPCOAT | PERFORMANCE |
| Polyvinylbutyral | 24 hr protection |
| Novolak resin | limited protection (20 min); image residues |
| Polybutylmethacrylate | limited protection (10 min) |

Thus, different resists and topcoat combinations are selected to provide protection of acid sensitive resist with a minimum of one extra coat and bake process step.

While only the preferred embodiments of the present invention are described above, many potential modifications which fall within the generic concept will occur to those skilled in the art upon a reading of the present disclosure. Such modifications in terms of topcoat polymeric materials which have the properties and performances as here set forth are within the teaching of the present invention and within its scope as set forth in the claims which follow.

What is claimed is:

1. The method of protecting acid catalyzed resist composition from contamination by vapors of organic or inorganic bases comprising the steps of
   (a) coating a substrate with a first layer of an acid catalyzed resist composition which is sensitive to ultraviolet light, e-beam, or x-ray radiation, and
   (b) overcoating the first layer of acid catalyzed resist composition with a thin film of a polymeric film forming composition to form a second layer which is sufficiently impermeable to vapors of organic and inorganic bases to prevent desensitization of the resist composition, wherein said second layer comprises a polymer having acidic moieties, and said second layer is soluble in aqueous alkaline developer.

2. The method of claim 1 wherein the polymeric film forming composition is selected from the group consisting of polyacrylic acid, and polystyrene suflonic acid.

3. The method of claim 2 wherein the polymeric film forming composition has a molecular weight of from about 1000 to 500.

4. The method of claim 2 wherein the polymeric film is applied in a thickness of from about 500 to 5000 Angstroms.

5. A protective topcoat for a substrate comprising an ultraviolet-, e-beam-, or x-ray- radiation sensitive acid catalyzed resist composition, which topcoat comprises a thin film of a polymeric film forming composition which is sufficiently impermeable to vapors of organic and inorganic bases to prevent desensitization of the resist composition, wherein said top coat comprises a polymer having acidic moieties, and said topcoat is soluble in aqueous alkaline developer.

6. The protective topcoat of claim 5 wherein the polymeric film forming composition is selected from the group consisting of polyacrylic acid, and polystyrene sulfonic acid.

7. The protective topcoat of claim 6 wherein the polymeric film forming composition has a molecular weight from about 1000 to 5000.

8. The protective topcoat of claim 5 wherein the thickness of the thin film of the polymeric film forming composition is from about 500 to 5000 Angstroms.

* * * * *

UNITED STATES PATENT AND TRADEMARK OFFICE
CERTIFICATE OF CORRECTION

PATENT NO. : 5,240,812

DATED : August 31, 1993

INVENTOR(S) : W.E. Conley, R.W. Kwong, R.J. Kvitek, R.N. Lang, C.F. Lyons, S.S. Miura, W.M. Moreau, H.S. Sachdev, and R.L. Wood It is certified that error appears in the above-identified patent and that said Letters Patent is hereby corrected as shown below:

In column 1, line 16, after "3,753,715 sets forth" change "know" to --known--. In the same line, delete "a".

In claim 1, line 2, change "composition" to read --compositions--.

In claim 2, line 3, change "suflonic" to read --sulfonic--.

In claim 3, line 3, change "500" to read --5000--.

Signed and Sealed this

Fifteenth Day of March, 1994

Attest:

BRUCE LEHMAN

Attesting Officer    Commissioner of Patents and Trademarks